(12) United States Patent
Vanhooren et al.

(10) Patent No.: US 10,103,074 B2
(45) Date of Patent: Oct. 16, 2018

(54) METHOD TO IMPROVE ANALOG FAULT COVERAGE USING TEST DIODES

(71) Applicant: SEMICONDUCTOR COMPONENTS INDUSTRIES, LLC, Phoenix, AZ (US)

(72) Inventors: Ronny Vanhooren, Evergem (BE); Wim Dobbelaere, Ninove (BE); Vahap Baris Esen, Heverlee (BE); Anthony B. G. Coyette, Braine-L'Alleud (BE); Georges G. E. Gielen, Kessel-lo (BE)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 71 days.

(21) Appl. No.: 15/073,009

(22) Filed: Mar. 17, 2016

(65) Prior Publication Data

US 2017/0077003 A1    Mar. 16, 2017

Related U.S. Application Data

(60) Provisional application No. 62/218,755, filed on Sep. 15, 2015.

(51) Int. Cl.
| | |
|---|---|
| *G01R 31/26* | (2014.01) |
| *H01L 21/66* | (2006.01) |
| *H01L 27/08* | (2006.01) |
| *H01L 27/088* | (2006.01) |
| *G06F 17/50* | (2006.01) |
| *G01R 31/28* | (2006.01) |
| *G01R 31/3167* | (2006.01) |

(52) U.S. Cl.
CPC .......... *H01L 22/30* (2013.01); *G01R 31/2856* (2013.01); *G01R 31/3167* (2013.01);
(Continued)

(58) Field of Classification Search
CPC ............ G01R 31/2632; G01R 31/2633; G01R 31/2635; G01R 31/00; G01R 31/08;
(Continued)

(56) References Cited

U.S. PATENT DOCUMENTS

| | | | | |
|---|---|---|---|---|
| 3,132,304 A | * | 5/1964 | Lukoff ................... | G01R 31/30 324/500 |
| 4,894,605 A | * | 1/1990 | Ringleb ............. | G01R 31/2884 324/537 |

(Continued)

OTHER PUBLICATIONS

Coyette et al., "Automated testing of mixed-signal integrated circuits by topology modification," IEEE 33rd VLSI Test Symposium (VTS), Apr. 27-29, 2015.
(Continued)

*Primary Examiner* — Tung X Nguyen
*Assistant Examiner* — Robert P Alejnikov, Jr.
(74) *Attorney, Agent, or Firm* — IPTechLaw (57) ABSTRACT

Implementations of integrated circuits may include: one or more diodes each having an anode and a cathode, each of the one or more diodes may be coupled with a voltage domain. One or more test pins may be coupled with one or more diodes. The test pins may be configured to be coupled to a tester. The one or more diodes may be positioned on one or more internal analog nodes to detect the presence of one or more analog faults. The one or more diodes may be configured to remain inactive during regular operation of the integrated circuit.

12 Claims, 13 Drawing Sheets

(52) U.S. Cl.
CPC ...... *G06F 17/5063* (2013.01); *G06F 17/5081* (2013.01); *H01L 27/088* (2013.01); *H01L 27/0814* (2013.01); *G06F 2217/14* (2013.01); *H01L 22/34* (2013.01)

(58) Field of Classification Search
CPC ........ G01R 31/28; G01R 31/10; G01R 31/26; G01R 31/2642; G01R 31/2648; G01R 31/2831; G01R 31/31702; G01R 1/06; G01R 1/067; G01R 31/31901
USPC .......... 324/762.07, 500, 512, 522, 523, 527, 324/762.01, 555
See application file for complete search history.

(56) References Cited

U.S. PATENT DOCUMENTS

| | | | |
|---|---|---|---|
| 7,119,597 B1* | 10/2006 | Barrett | G01R 31/14 327/291 |
| 7,262,605 B2* | 8/2007 | Seo | G01K 7/24 324/434 |
| 2014/0132273 A1* | 5/2014 | Iwakiri | H05B 33/0815 324/414 |

OTHER PUBLICATIONS

Hsu, Chun-Lung, "Control and Observation Structure for Analog Circuits with Current Test Data," J. Electronic. Testing, V. 20, p. 39-44 (2004).

Jarwala et al., "A Framework for Design for Testability of Mixed Analog/Digital Circuits," IEEE 1991 Custom Integrated Circuits Conference, (1991).

Mitall et al., "DFT for Extremely Low Cost Test of Mixed Signal SOCs with Integrated RF and Power Management," IEEE International Test Conference (2011).

Sunter et al., "A mixed-signal test bus and analog BIST with 'unlimited' time and voltage resolution," Sixteenth IEEE European Test Symposium, (2011).

Wey, Chin-Long, "Built-in Self-Test (BIST) Structure for Analog Circuit Fault Diagnosis," IEEE Transactions on Instrumentation and Measurement, V. 39, N. 3, p. 517-521 (Jun. 1990).

* cited by examiner

METHOD TO IMPROVE ANALOG FAULT COVERAGE USING TEST DIODES

CROSS REFERENCE TO RELATED APPLICATIONS

This document claims the benefit of the filing date of U.S. Provisional Patent Application 62/218,755, entitled "Analog Fault Coverage Using Test Diodes" to Ronny Vanhooren, Wim Dobbelaere, Vahap Baris Esen, Anthony B. G. Coyette, and Georges G. E. Gielen which was filed on Sep. 15, 2015, the disclosure of which is hereby incorporated entirely herein by reference.

BACKGROUND

1. Technical Field

Aspects of this document relate generally to integrated circuits having analog nodes therein such as components for vehicles.

2. Background

Conventionally, to test for analog faults in integrated circuits the structure of each analog component is tested by testing the function of the circuit. In some conventional situations, the functions of the individual circuit components are tested individually.

SUMMARY

Implementations of integrated circuits may include: one or more diodes each having an anode and a cathode, where each of the one or more diodes may be coupled with a voltage domain. One or more test pins may be coupled with the one or more diodes. The test pins may be configured to be coupled to a tester. The one or more diodes may be positioned on one or more internal analog nodes to detect the presence of one or more analog faults. The one or more diodes may be configured to remain inactive during regular operation of the integrated circuit.

Implementations of integrated circuits may include one, all, or any of the following:

The one or more diodes may be transistors.

The one or more diodes may not be active components of the integrated circuit and may not be activated after testing of the integrated circuit.

Implementations of integrated circuits may include: one or more diodes each having an anode and a cathode coupled to one or more internal analog nodes and a test pin coupled to the one or more diodes. When a test voltage is applied to the test pin, a flow of current at the one or more diodes detects the presence of a fault at the one or more internal analog nodes. The one or more diodes may be configured to remain inactive during regular operation of the integrated circuit.

Implementations of integrated circuits may include one, all, or any of the following:

The one or more diodes may be transistors.

The one or more diodes may not be active components of the integrated circuit and may not be activated after testing of the integrated circuit.

The anodes of the one or more diodes may be coupled together within a single voltage domain and when the test voltage is applied to the test pin, the flow of current at the anodes may detect the presence of the fault and the fault may be a pull-down fault.

The cathodes of the one or more diodes may be coupled together within a single voltage domain and when the test voltage is applied to the test pin, the flow of current at the cathodes may detect the presence of the fault and the fault may be a pull-up fault.

Implementations of an analog test circuits for integrated circuits may be designed using implementations of a method of designing analog testing circuits for integrated circuits. The method may include coupling one or more diodes each having an anode and a cathode, where the one or more diodes are coupled to one or more internal analog nodes. The method may also include coupling one or more test pins to the one or more diodes and when a test voltage is applied to the one or more test pins, detecting the fault by the flow of current at the one or more diodes. The method may also include the one or more diodes not being activated during normal operation of the integrated circuit.

Implementations of a method of designing analog test circuits for integrated circuits may include one, all or any of the following:

The one or more diodes may be transistors.

The one or more diodes may not be active components of the integrated circuit and may not be activated again after testing of the integrated circuit.

The presence of analog faults in an integrated circuit may be tested for by using implementations of a method of testing for the presence of analog faults in an integrated circuit. The method may include providing one or more diodes each having an anode and a cathode, the one or more diodes coupled to one or more internal analog nodes, all operably coupled with a test pin. The method may also include applying a potential across the diodes to generate a current. If a pull-up fault exists, then detecting the current may occur at the cathode. If a pull-down fault exists, then detecting the current may occur at the anode. The one or more diodes may not be an active component of the integrated circuit and may not be activated again after testing of the integrated circuit.

Implementations of a method of testing for the presence of analog faults in integrated circuits may include one, all or any of the following:

The one or more diodes may be transistors.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended method to improve analog fault coverage using test diodes and integrated circuit implementations containing test diodes will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such integrated circuits, and implementing components and methods, consistent with the intended operation and methods.

Figure 1A:
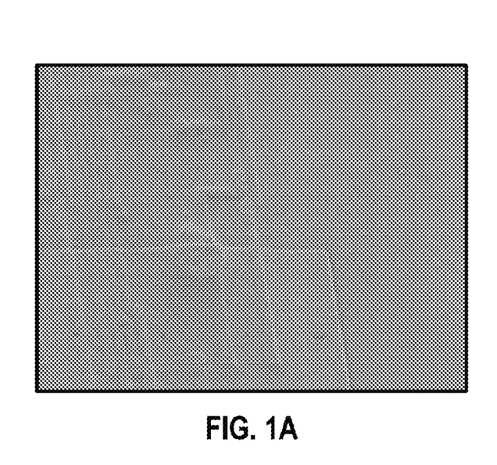
FIG. 1A-1C are scanning electron micrographs of defects causing analog faults during operation that were not detected using conventional analog testing methods.
Figure 1B:
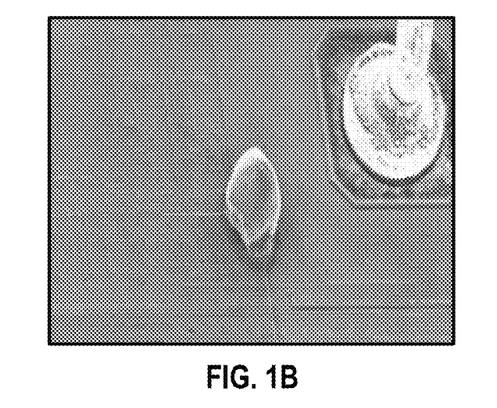
Figure 1C:
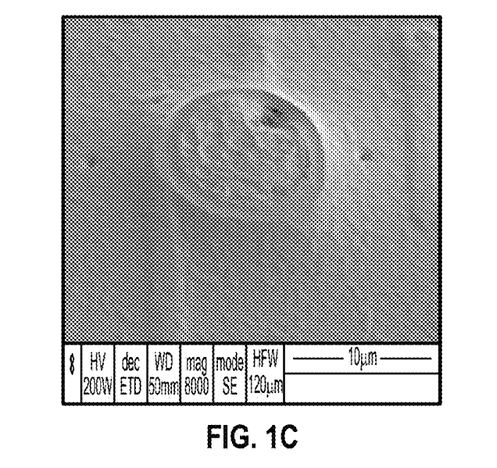
Figure 2:
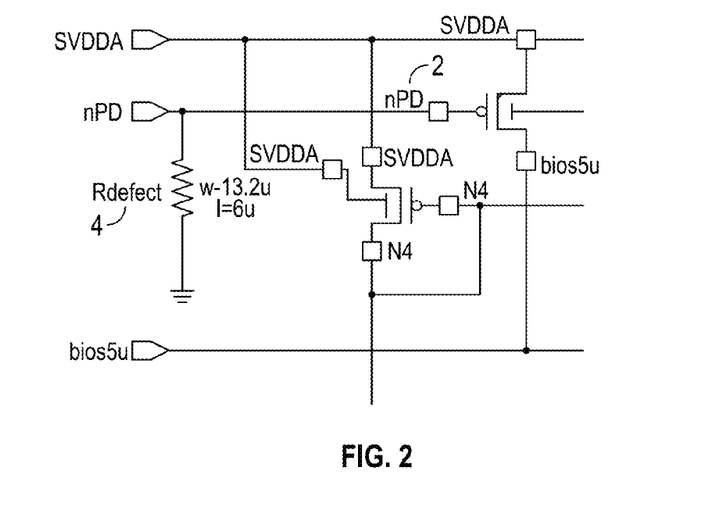
FIG. 2 is a circuit diagram of a defect undetected by conventional analog testing methods which presents as a resistance.

FIG. 1A-1C illustrates examples of faults discovered on customer returned automotive parts as captured on scanning electron micrographs. Each FIG. 1A-1C is a different particle found on exactly the same track 2 (nPD) in exactly the same block of the circuit as illustrated in FIG. 2. Referring to FIG. 1A, a crack 1 is illustrated running across the track 2. Referring to FIG. 1B, a particle 3 was found on the track through a scanning electron micrograph. Referring to FIG. 1C, a defect 5 in the metal of the integrated circuit was discovered after failure of the device. These faults on the integrated circuit were not apparent to the naked eye because of the size of the integrated circuits and because the components of the integrated circuits (traces, devices, diodes, and the like) are formed into the device and cannot be later removed once formed. These faults were not discovered using conventional functional analog tests because the item that was tested, a comparator, was still functioning within specification but, further testing showed that it was not functioning at the correct speed. Specifically, leakage currents of top-mirror biased the comparator such that it still worked within specifications, but not properly enough to prevent failure/malfunction in the field. Comparator speed was not an item tested by the original testing specification. Referring to FIG. 2, the defect discovered on nPD track 2 may be represented by a fault 4 which increased resistance in the circuit leading to the leakage currents observed.

Figure 3:
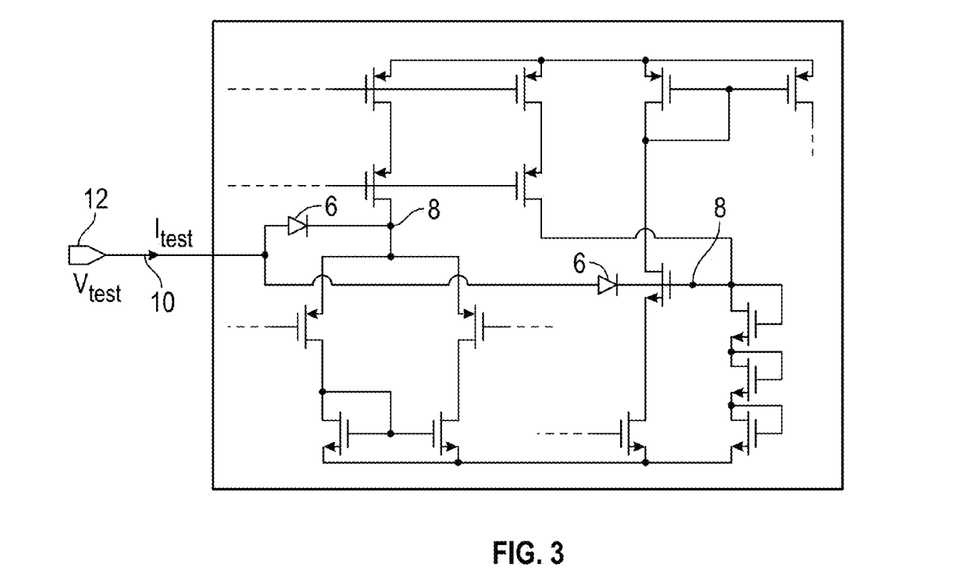
FIG. 3 is a circuit diagram of a possible configuration of an implementation of a testability circuit.

Referring to FIG. 3, an implementation of an integrated circuit having one or more testing diodes is illustrated. Testing diodes 6 may be connected to/with every analog node 8 which is not observable through functional testing or not controllable for testing during a full analog functional test of a particular integrated circuit implementation. In the implementation illustrated in FIG. 3, the anodes of each diode 6 are connected together for a given voltage domain. As used herein, a voltage domain is defined as a group of nodes that operates within the same voltage range. Any analog integrated circuit can be divided into a number of voltage domains by defining a certain voltage range for each of them. Here, the threshold voltage of a diode limits and also defines the maximum range for every voltage domain that is to be tested by using one test pin. The anodes of each of the one or more diodes are then coupled to a test pin 10 which is, during the normal operation, connected to the lowest potential in the circuit (ground) that does not disturb the normal operation of the integrated circuit. In some implementations, the test pin could be connected to a constant current source, and the resulting voltage at the test pin 10 is observed to detect faults. Also, in various implementations, the test pin 10 may be a dedicated pin used only for testing, or a pin that can be used during the testing process and then subsequently can be used for regular operation of the integrated circuit to perform functions of the integrated circuit.

When a predefined voltage is applied to the test pin, a flow of current at one of the anodes of the test diodes 6 detects the presence of a pull-down fault at the circuit. If no flow of current is detected, then no pull-down fault concerning those nodes exists. A pull-down fault is defined as a fault representing a defect that tends to pull the direct current (DC) voltage of a node lower than it was designed. After testing of the circuit is completed, if the circuit passes testing with no faults detected, the diodes 6 remain inactive during normal operation of the integrated circuit. Similarly, because the diodes 6 remain inactive for good circuits (those without faults) negligible loading effect may be applied to the circuitry even during operation in testing mode.

Figure 4:
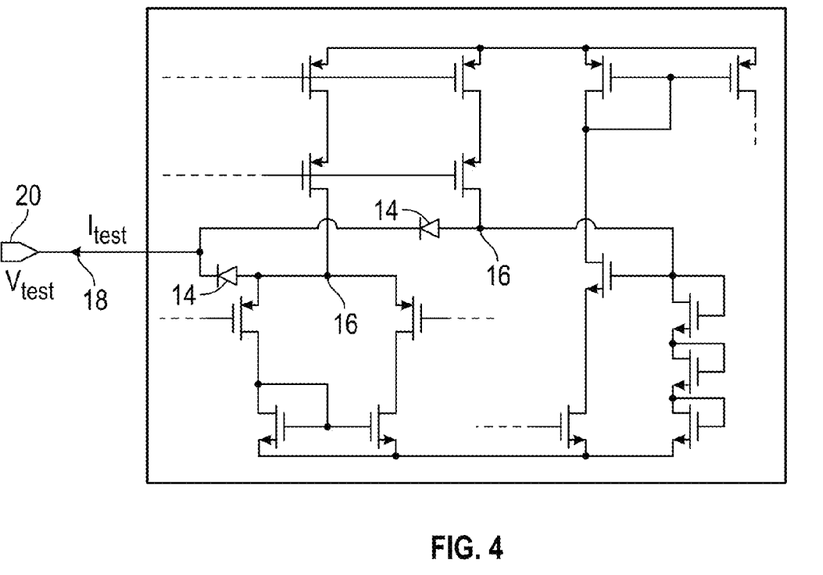
FIG. 4 is a circuit diagram of another possible configuration of an implementation of a testability circuit.

Referring to FIG. 4, another implementation of an integrated circuit having one or more test diodes is illustrated. This implementation may test for pull-up faults. A pull-up fault is defined as a fault representing a defect that tends to pull the DC voltage of a node higher than it is designed. During design of the integrated circuit testing diodes 14 may be connected to/with every analog node 16 that is not observable or not controllable using analog functional testing methods. In the implementation illustrated in FIG. 4, the cathodes of each diode 14 are connected together for a single voltage domain. The cathodes are then coupled to a test pin 18 which is, during normal operation, connected to the power supply (VDD) 20. In the test mode, when a predefined voltage is applied to the test pin, a flow of current at one of the cathodes of the test diodes 14 detects the presence of a pull-up fault. As before, if no current is detected, then no fault exists. After testing of the circuit is completed, the diodes 14 remain inactive during normal operation of the integrated circuit. Similarly, because the diodes 14 remain inactive for good circuits, negligible loading effect may be applied to the circuitry even during test mode.

Figure 5:
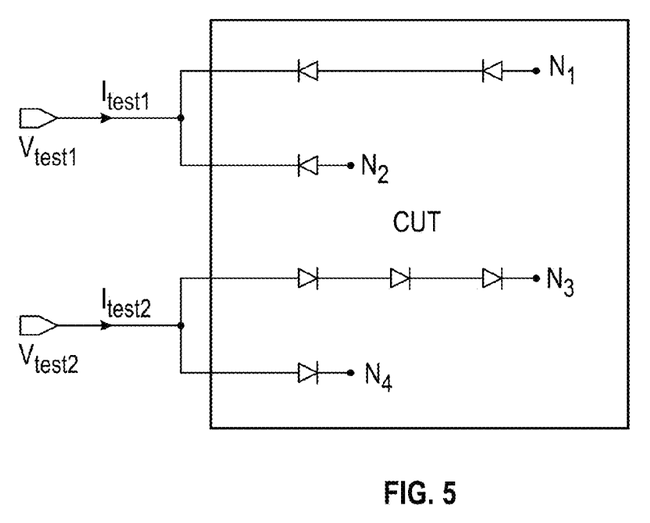
FIG. 5 is a circuit diagram of another possible configuration of an implementation of a testability circuit.

Referring to FIG. 5, another implementation of an integrated circuit having one or more testing diodes is illustrated. In this implementation, usage of multiple diodes for testing one circuit node is shown. This configuration allows connecting different voltage domains separated by multiples of the threshold voltage of a diode using a single test pin. By non-limiting example, the voltage domain of N1 may be one threshold voltage higher than the voltage domain of N2, so they can be tested together for pull-up faults. In another example from FIG. 5, the voltage domain of N3 may be two threshold voltages lower than the voltage domain of N4 and one test pin may be enough to test pull-down faults affecting any of these nodes. Because the threshold voltages are related to each other by being multiples of a single diode threshold voltage, the deviation from that relationship is what is used during testing at the test pin to detect the presence of a fault.

In a further implementation, the testing diodes may be used for injecting or subtracting current from multiple nodes of a circuit under test by only using a limited number of test pins. This may make it possible to increase controllability of several nodes without adding large area overhead or an excessive number of additional test pins. The configuration type which is used to detect pull-down faults enables injecting current to a group of nodes from the same voltage domain in order to increase the controllability on those nodes. To subtract current from a group of nodes belonging to one voltage domain, the configuration proposed to detect pull-up faults can be used in a similar manner.

Figure 6:
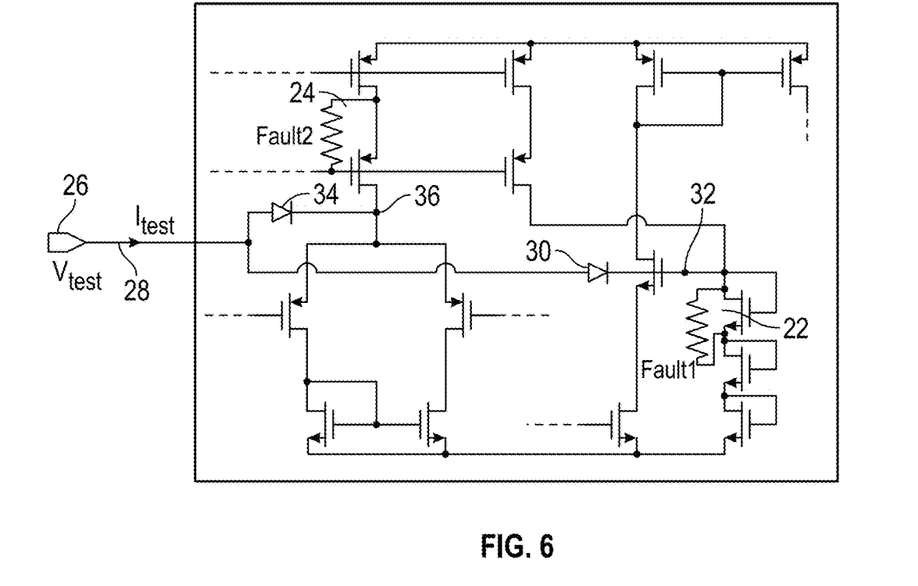
FIG. 6 is a circuit diagram of a possible configuration of an implementation of a testability circuit illustrating two possible faults.

Referring to FIG. 6, a simulation circuit testing for pull-down faults is illustrated. Two faults 22 and 24 are illustrated. When a predefined voltage from the tester 26 is applied to the test pin 28, current will be detected at the anode of diodes 30 and 34. By non-limiting example, the diodes used are NPPWD, Nplus Pwell Diode, a typical PN-diode built using a highly doped n-region inside a Pwell. Diode 30 is connected to analog node 32 and will detect the fault 22 on node 32. Diode 34 is connected to analog node 36 and will detect the fault 24 on node 34. After testing of the circuit is completed, the diodes 30 and 34 remain inactive during normal operation of the integrated circuit by connecting the test pin 28 to the ground. Similarly, because the diodes 30 and 34 remain inactive for good circuits, negligible loading effect may be applied to the circuit even during test mode.

Figure 7:
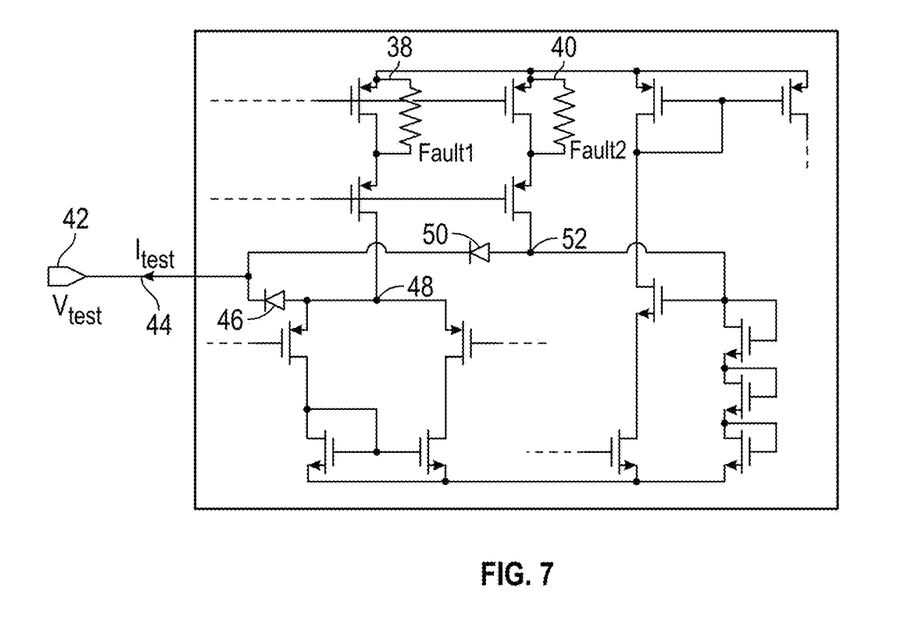
FIG. 7 is a circuit diagram of another possible configuration of an implementation of a testability circuit illustrating two possible faults.

Referring to FIG. 7, a simulation circuit testing for pull-up faults is illustrated. Two faults 38 and 40 are illustrated. When a predefined voltage from the tester 42 is applied to the test pin 44, current will be detected at the cathode of diodes 46 and 50. Diode 46 is connected to analog node 48 and can detect fault 38. Diode 50 is connected to analog node 52 and can detect fault 40. After testing of the circuit is completed, the diodes 46 and 50 remain inactive during normal operation of the integrated circuit by connecting the test pin 44 to VDD. Similarly, because the diodes 46 and 50 remain inactive for good circuits, no loading effect may be applied to the circuitry even during test mode.

Figure 8:
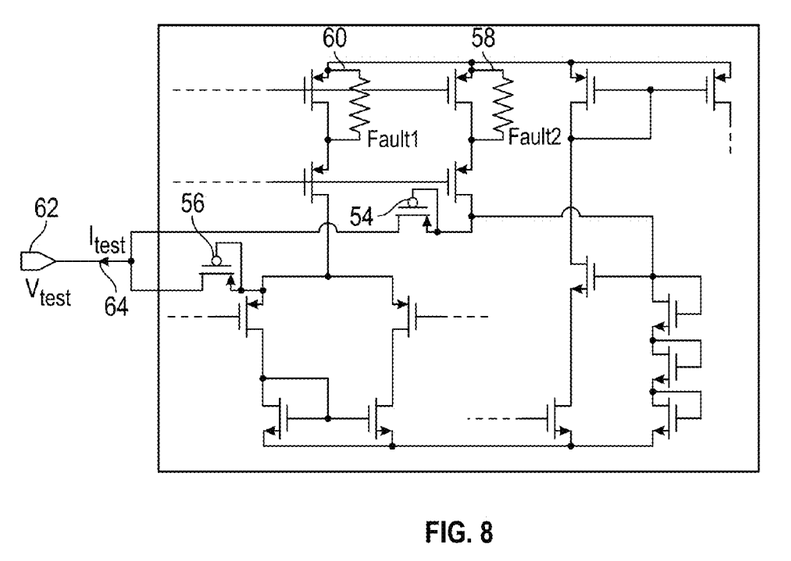
FIG. 8 is a circuit diagram of another possible configuration of an implementation of a testability circuit using transistors as the diodes and showing two possible faults.

Referring to FIG. 8, a simulation circuit using transistors for the diodes 54 and 56 is illustrated. By non-limiting example, the transistors 54 and 56 may be p-channel metal oxide semiconductors (PMOS), n-channel metal oxide semiconductors (NMOS), or bipolar junction transistor (BJT), or any other transistor type. Two faults 58 and 60 are illustrated. When a voltage is applied by the tester 62 to the test pin 64 current can be detected at the transistors 54 and 56. Fault 58 is detected by the presence of current at transistor 54. Fault 60 is detected by the presence of current at transistor 56. After testing of the circuit is completed, the transistors 56 and 54 remain inactive during normal operation of the integrated circuit by connecting the test pin 64 to VDD. Similarly, because the transistors remain inactive for good circuits, negligible loading effect may be applied to the circuitry even during test mode.

Circuit implementations like those disclosed herein may be designed for any integrated circuit having analog circuits. Implementations of a method of designing such circuits may involve coupling one or more testing diodes having an anode or a cathode to an internal analog node in the integrated circuit. The method may include coupling one or more diodes to the test pin such that when a test voltage is applied to the test pin a fault is detected by the flow of current at the test diodes. The one or more diodes may be transistors. The diodes may not be active components of the integrated circuit and may not be activated again after testing the integrated circuit.

Figure 9:
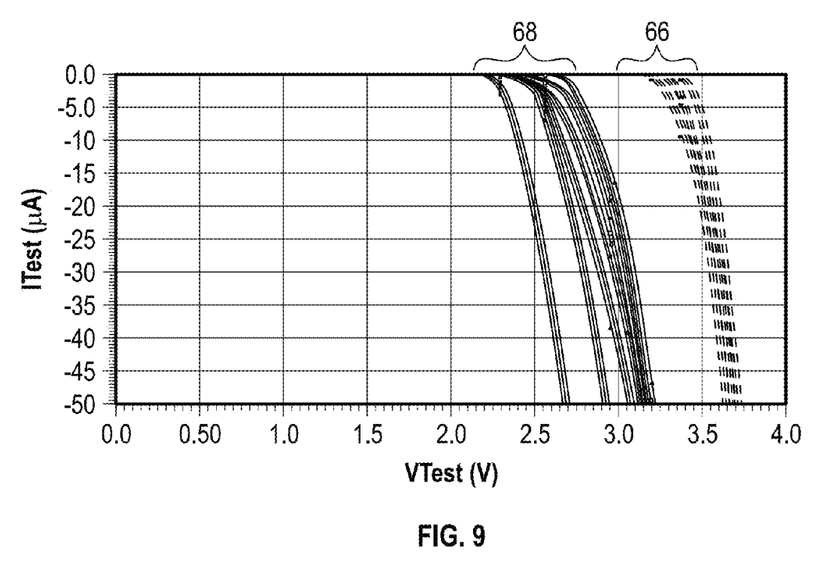
FIG. 9 is a graph showing the separation between the responses of good parts and faulty parts from the circuit in FIG. 6.

Referring to FIG. 9, a graph showing the separation between the responses of good parts 66 and faulty parts 68 from the simulation circuit in FIG. 6 for pull-down faults by NPPWD diodes is illustrated. The simulation was performed on two faulty and one good circuit on 8 corners and 1 typical. By inspection, there is good separation between the good circuits 66, having no faults, and the faulty circuits 68. The results of this simulation suggest that the implementation of this design on analog testing may be straightforward.

Figure 10:
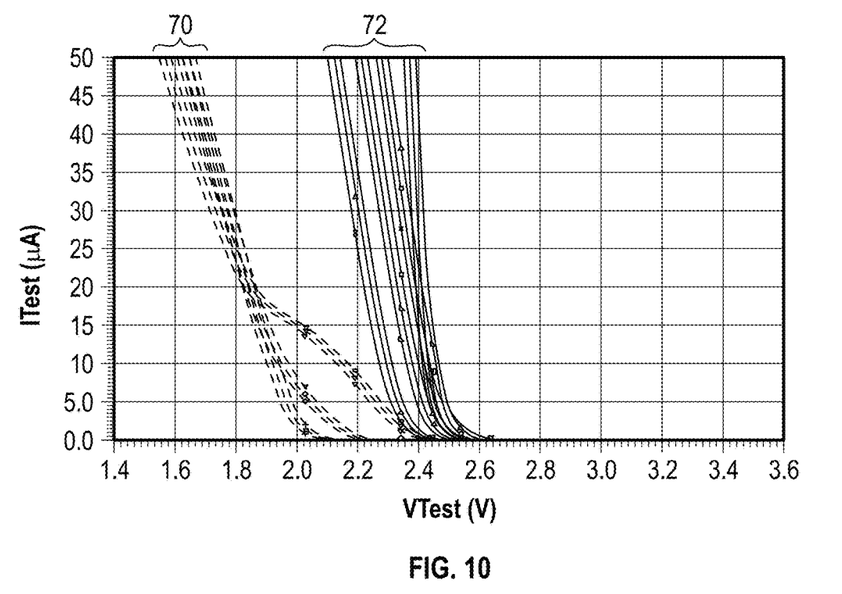
FIG. 10 is a graph showing the separation between the responses of good parts and faulty parts from the circuit in FIG. 7.

Referring to FIG. 10, a graph showing the separation between the responses of good parts 70 and faulty parts 72 from the circuit in FIG. 7 for pull-up faults by NPPWD diodes is illustrated. The simulation was also performed on two faulty and one good circuit on 8 corners and 1 typical. Again, by inspection, there is a good separation between the good circuits 70 and faulty circuits 72. Because of this, the ability to detect the presence of the faults in various implementations may be reliable and repeatable.

Figure 11:
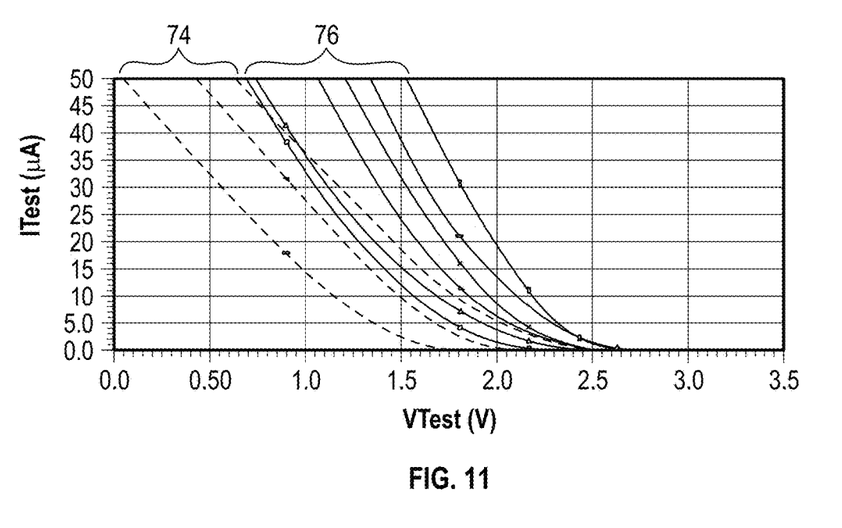
FIG. 11 is a graph showing the separation between the responses of good parts and faulty parts for each process technology corner from the circuit in FIG. 8.

Referring to FIG. 11, a graph showing the separation between the responses of good parts 74 and faulty parts 76 from the circuit in FIG. 8 detecting pull-up faults by PMOS transistor diodes is illustrated. The simulation was run for two faults and one good circuit on two corners and one typical. The separation between good and faulty circuits for each corner again indicates that it is possible to use this technique to identify faults at internal nodes in the circuit.

Figure 12A:
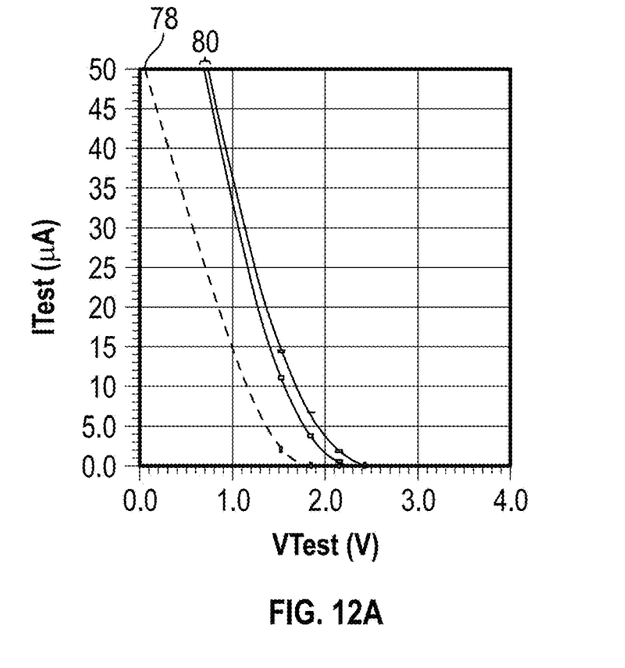
FIGS. 12A-12B are graphs showing transient simulations from two different corners.
Figure 12B:
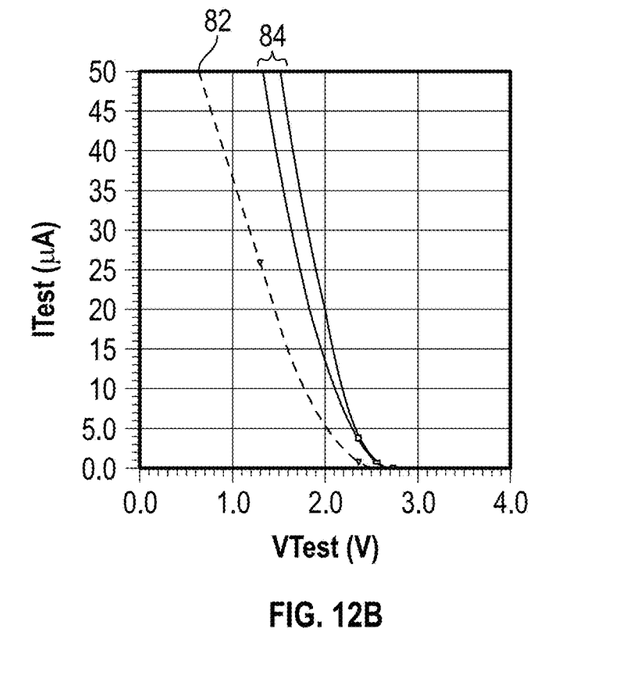

Referring to FIGS. 12A-12B, graphs showing transient simulations for the circuit in FIG. 8 from two different corners are illustrated. In FIG. 12A, there is a good separation between the responses of a good measurement part 78 and the faulty parts 80. In FIG. 12B, there is likewise a good separation between the responses of a good part 82 and faulty parts 84. In combination with Dynamic Part Averaging Testing (DPAT), one corner per wafer, separation is excellent, which indicates that implementation in real test environments can be straightforward.

Figure 13:
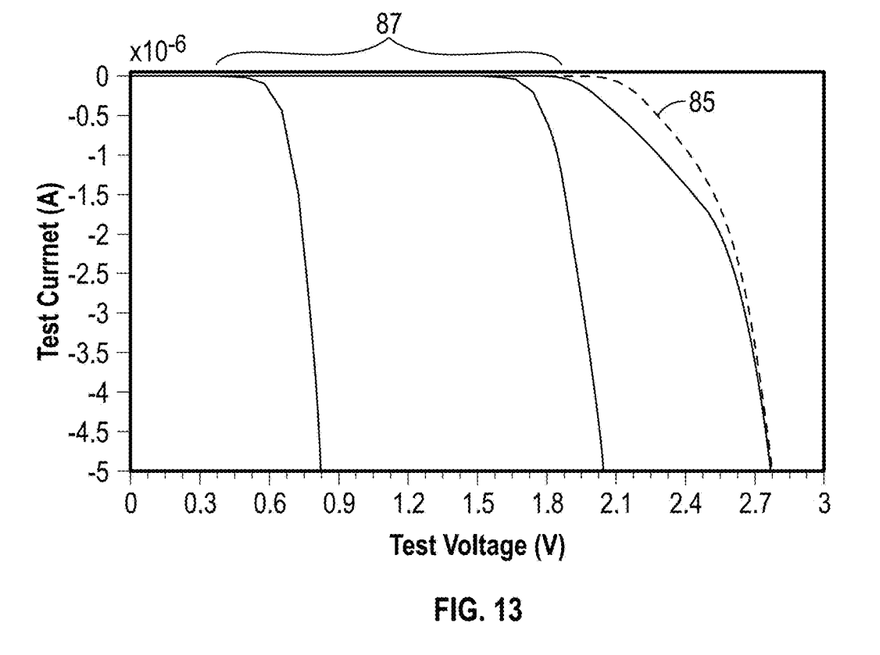
FIG. 13 is a graph showing testing results from a circuit implementation.
Figure 14:
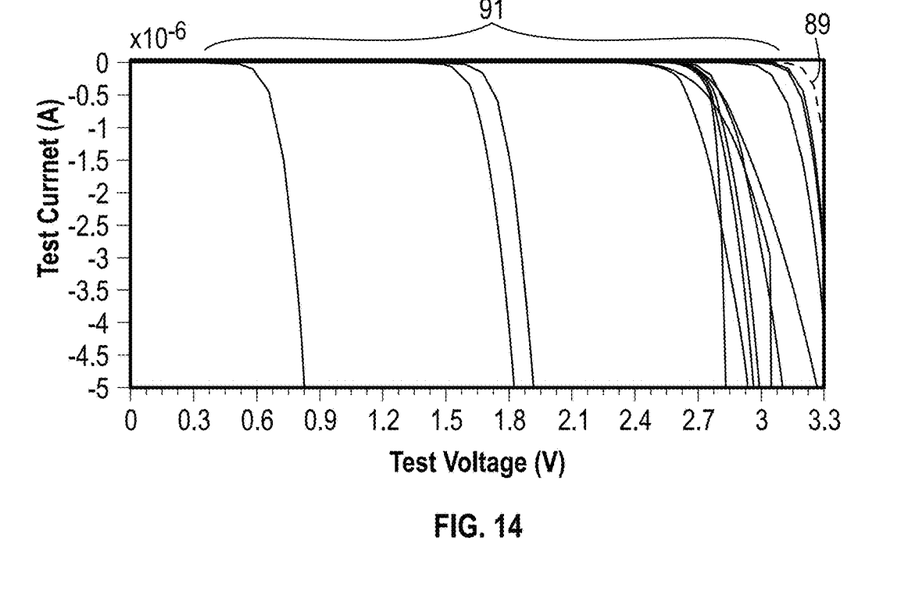
FIG. 14 is another graph showing testing results from a circuit implementation.
Figure 15:
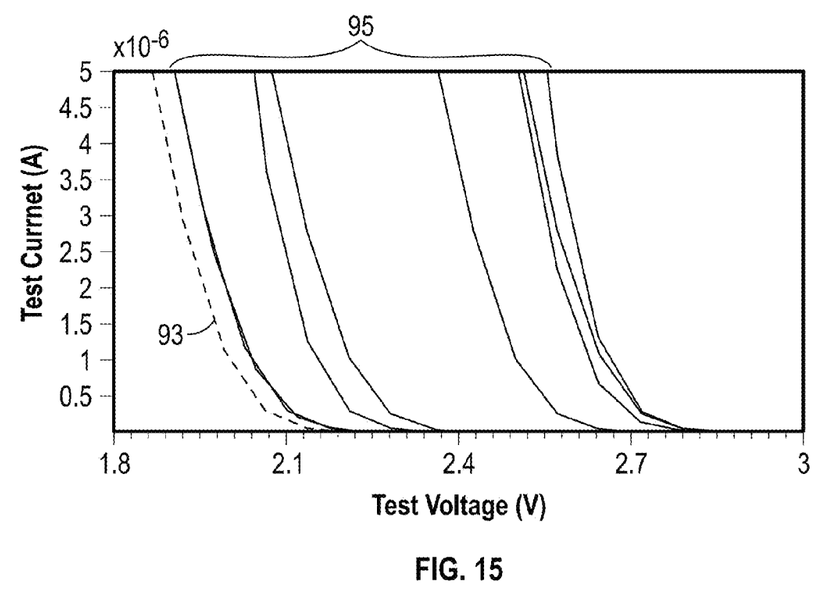
FIG. 15 is another graph showing testing results of a circuit implementation.

Referring to FIG. 13, a graph showing simulation results of an implementation on an industrial circuit is illustrated. Here, the good response is represented by 85 and faulty responses are represented by 87. In this test, 9 pull-down faults 87 were detected by 4 NMOS transistor. Now referring to FIG. 14, 37 pull-down faults 91 were detected by 18 NMOS diodes in a real circuit. The good response is represented by 89. Now referring to FIG. 15, 15 pull-up faults 95 were detected using 5 NMOS diodes in a real circuit, where the good response is represented by 93. These results demonstrate proof of the concept of using diodes and transistors to detect the presence of the faults.

Figure 16A:
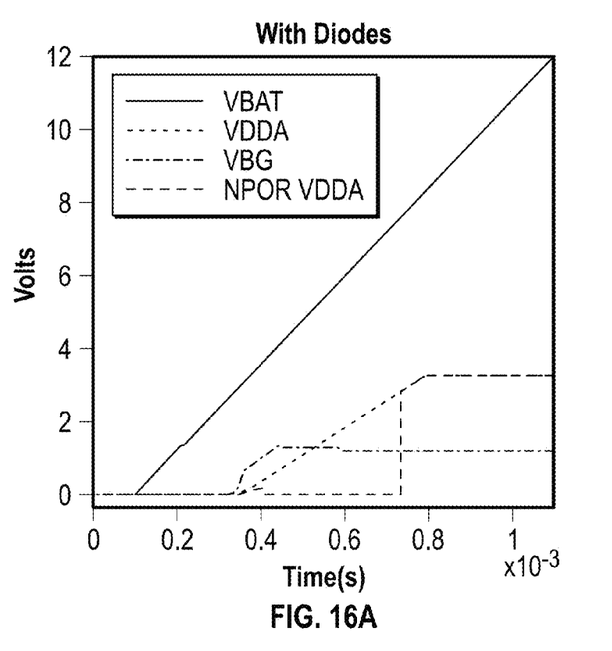
FIGS. 16A-16B are graphs showing no change in start-up of integrated circuit implementations having testing diodes (FIG. 16A) compared to circuits not having testing diodes (FIG. 16B)
Figure 16B:
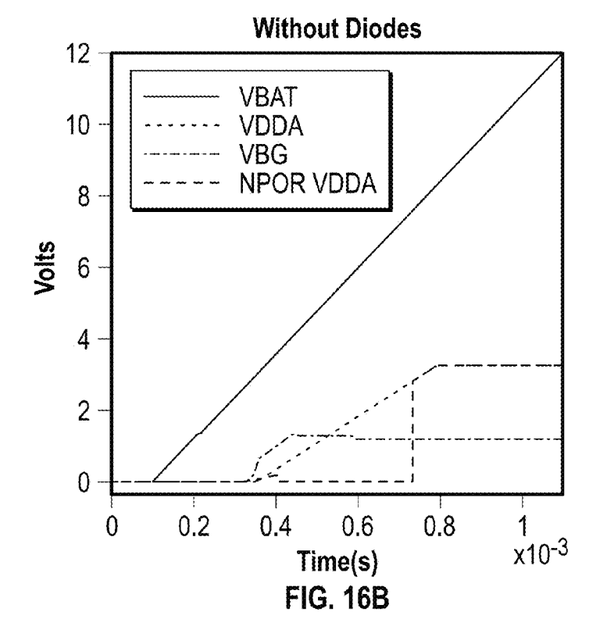

Referring to FIGS. 16A-16B, graphs showing no change in start-up behavior between integrated circuits having testing diodes (FIG. 16A) and those not having testing diodes (FIG. 16B) is illustrated. These graphs demonstrate that the testing diodes do not affect the function of the integrated circuit once testing has been completed and the testing diodes are configured to remain inactive during normal operation of the integrated circuit.

Figure 17:
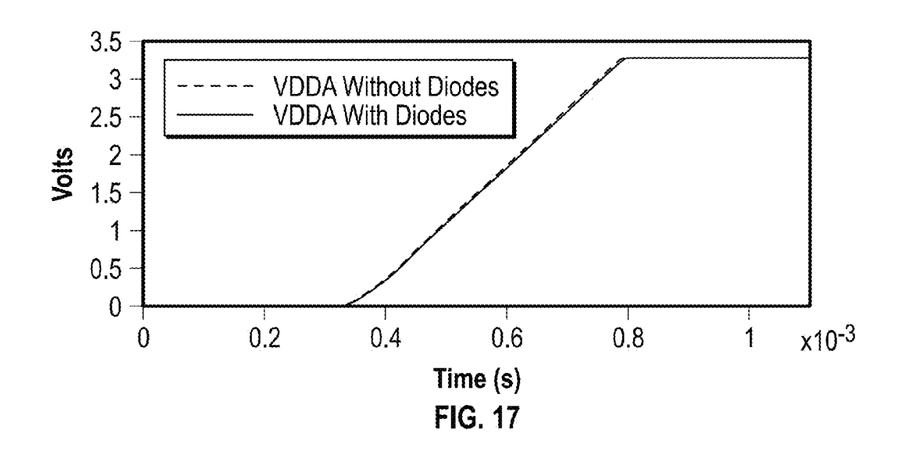
FIG. 17 is a graph showing a start-up comparison on regulated VDDA.
Figures 18, 19:
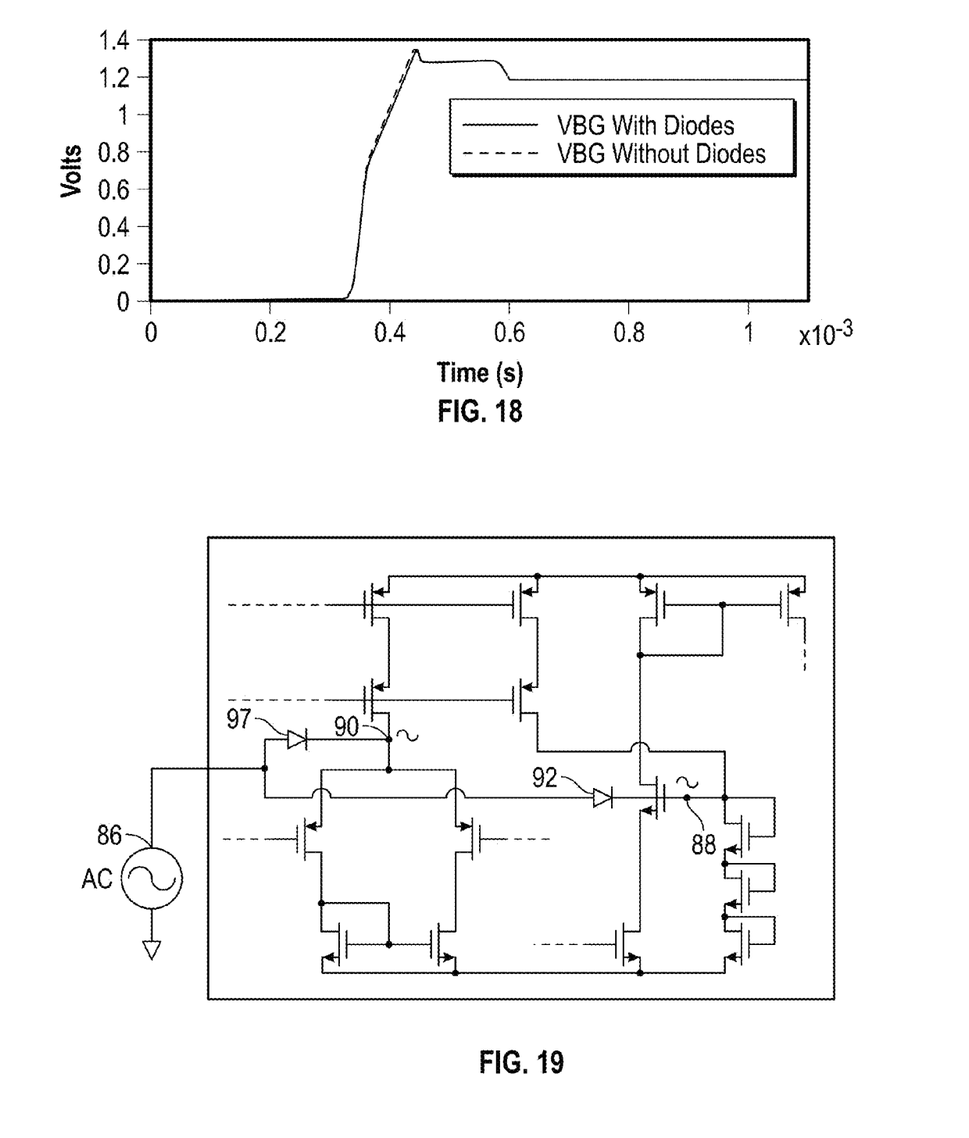
FIG. 18 is a graph showing a start-up comparison on VBG.
FIG. 19 is a circuit diagram used in AC simulation to check coupling between the test pins and the test nodes with reverse biased diodes.

Referring to FIG. 17, a graph showing another start-up comparison as tested on regulated supply voltage VDDA is illustrated. There is almost no impact on start-up with the addition of testing diodes. Referring to FIG. 18, a graph showing another start-up comparison as tested on VBG is illustrated. Here, there is minimal impact on the start-up of bandgap voltage VBG with the addition of testing diodes.

Figure 20:
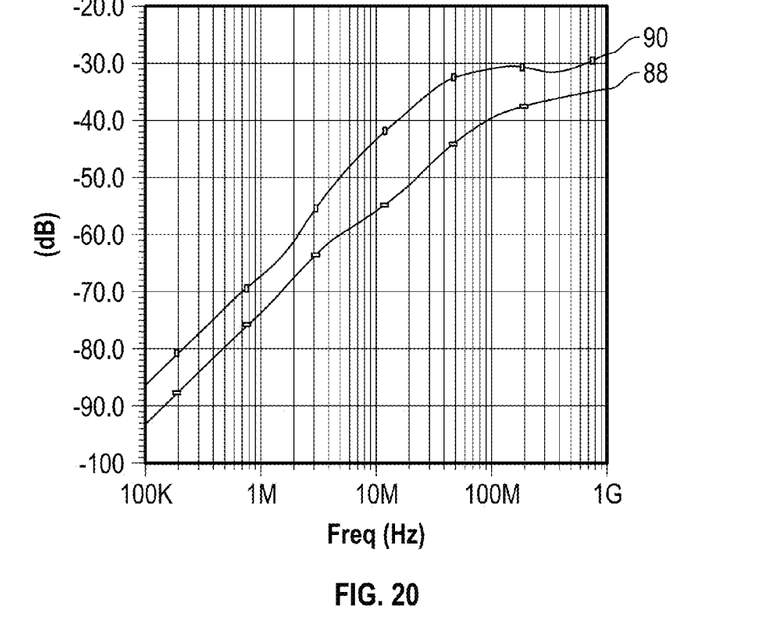
FIG. 20 is a graph of the AC simulation results from FIG. 19.

Further tests were performed to determine whether there is negligible interference because of the testing diodes on the integrated circuit. Referring to FIG. 19, a circuit diagram showing testing diodes connected to an AC source is illustrated. Referring to FIG. 20, a graph of the AC simulation from FIG. 19 is illustrated. The results show coupling between the test pin 86 and test nodes 88 and 90 with reverse biased diodes 92 and 97. The bottom line on the graph 88 corresponds to the node 88 in the circuit diagram (FIG. 19) and the top line 90 corresponds to the node 90 in the circuit diagram. The results illustrate that the addition of the test diodes may have negligible influence on most nodes in the frequency band of interest.

Figure 21:
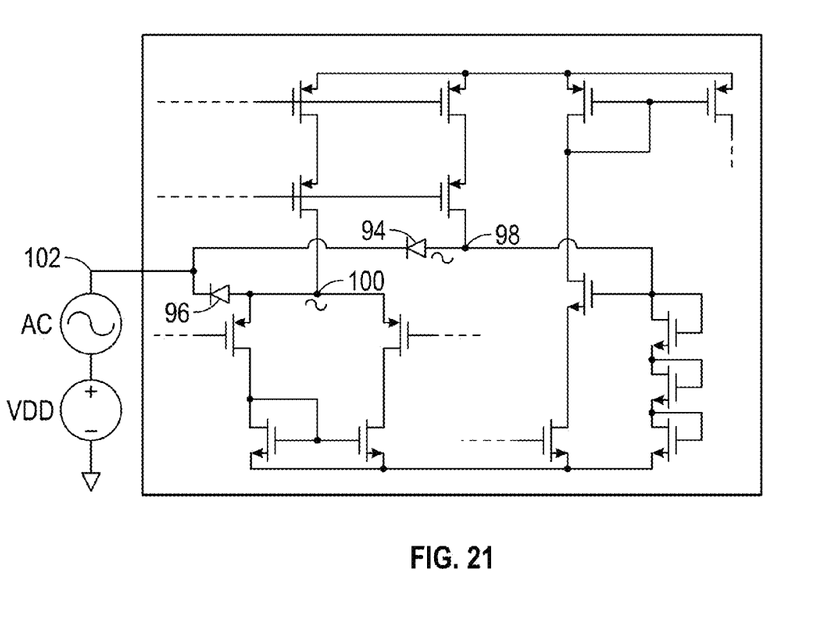
FIG. 21 is a circuit diagram used in another AC simulation to check coupling between the test pins and the test nodes with reverse biased diodes.
Figure 22:
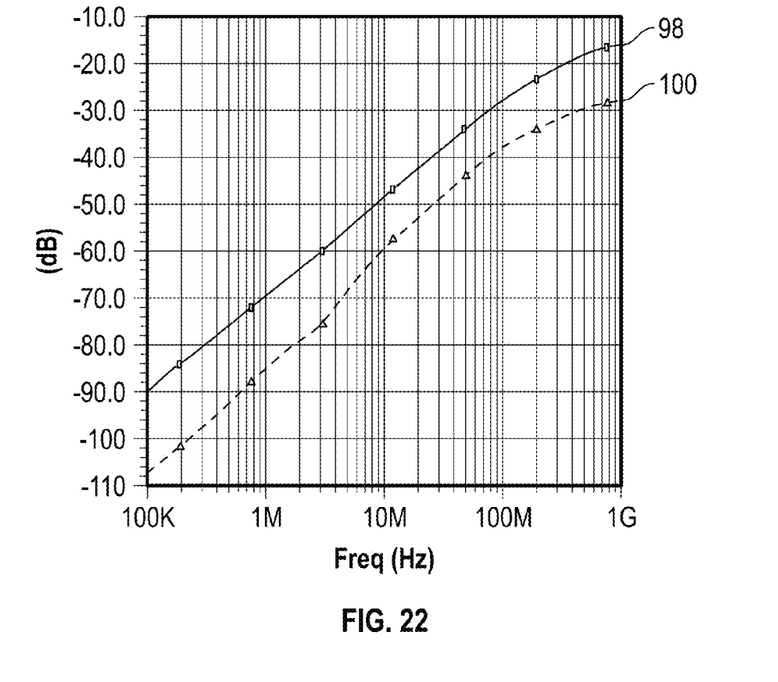
FIG. 22 is a graph of the AC simulation results from FIG. 21.

Referring to FIG. 21, another test was performed to determine whether negligible interference was created because of the testing diodes 94 and 96 on the nodes 98 and 100 of the analog circuit. An AC simulation was performed to check coupling between the test pin 102 and the test nodes 98 and 100 with reverse biased diodes 94 and 96. FIG. 22 illustrates a graph of the AC simulation of the circuit of FIG. 21, showing that the addition of the test diodes is likely to have negligible influence on most nodes in the frequency band of interest.

Figure 23:
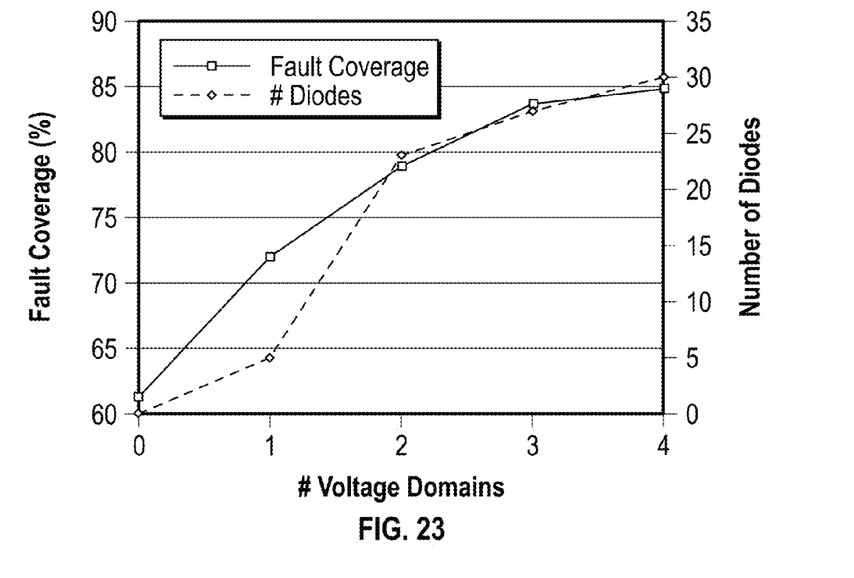
FIG. 23 is a graph showing an increase of fault coverage with an increase in the number of testing diodes.

Referring to FIG. 23, a graph showing the increase of fault coverage with an increase in the number of testing diodes is illustrated. Conventional methods of testing for analog faults provide less than optimal fault coverage, sometimes as little as 60% for a particular integrated circuit component. Coverage of an analog fault exists when it is observable and controllable. In contrast with conventional methods, as illustrated in FIG. 23, the use of testing diodes as described herein is capable to increase analog fault coverage to at least 85% or more in various implementations. As illustrated in the graph in FIG. 23, fault coverage increases as the number of testing diodes is increased with minimal increase in total area of the integrated circuit used and negligible interference on the nodes in the integrated circuit. In the actually fabricated circuit implementation disclosed herein, the increase in area of the circuit was 1.08% where the structure of the added diodes themselves represented only 0.0334% of the total area increase.

In places where the description above refers to particular implementations of integrated circuits, testing diodes for analog circuits and implementing components, sub-components, methods and sub-methods, it should be readily apparent that a number of modifications may be made without departing from the spirit thereof and that these implementations, implementing components, sub-components, methods and sub-methods may be applied to other analog integrated circuits.

What is claimed is:

1. An integrated circuit comprising:
one or more diodes each comprising an anode and a cathode, each of the one or more diodes coupled with a voltage domain; and
one or more test pins coupled with the one or more diodes;
wherein the test pins are configured to be coupled to a tester,
wherein the one or more diodes are not part of the tester and the tester is not part of the integrated circuit;
wherein the one or more diodes are positioned on one or more internal analog nodes to detect the presence of one or more analog faults; and
wherein the one or more diodes physically remain in the integrated circuit after detection and are configured to remain inactive during regular operation of the integrated circuit.

2. The integrated circuit of claim 1, wherein the one or more diodes are transistors.

3. The integrated circuit of claim 1, wherein the one or more diodes are not active components of the integrated circuit and are not activated after testing of the integrated circuit.

4. An integrated circuit comprising:
one or more diodes each having an anode and a cathode, the one or more diodes coupled to one or more internal analog nodes; and
a test pin coupled to the one or more diodes;
wherein when a test voltage is applied to the test pin, a flow of current at the one or more diodes detects the presence of a fault at the one or more internal analog nodes;
wherein the test voltage is not generated by the integrated circuit; and
wherein the one or more diodes physically remain in the integrated circuit after application of the test voltage and are configured to remain inactive during regular operation of the integrated circuit.

5. The integrated circuit of claim 4, wherein the one or more diodes are transistors.

6. The integrated circuit of claim 4, wherein the one or more diodes are not active components of the integrated circuit and are not activated after testing of the integrated circuit.

7. The integrated circuit of claim 4, wherein the anodes of the one or more diodes are coupled together within a single voltage domain; and
wherein when the test voltage is applied to the test pin, the flow of current at the anodes detects the presence of the fault and the fault is a pull-down fault.

8. The integrated circuit of claim 4, wherein the cathodes of the one or more diodes are coupled together within a single voltage domain; and wherein when the test voltage is applied to the test pin, the flow of current at the cathodes detects the presence of the fault, and the fault is a pull-up fault.

9. A method for designing an analog testing circuit for an integrated circuit, the method comprising:
   coupling one or more diodes each having an anode and a cathode, the one or more diodes coupled to one or more internal analog nodes;
   coupling one or more test pins to the one or more diodes; and
   when a test voltage is applied to the one or more test pins, detecting a fault by the flow of current at the one or more diodes;
   wherein the test voltage is not generated by the integrated circuit;
   wherein the one or more diodes physically remain in the integrated circuit after application of the test voltage and are not activated during normal operation of the integrated circuit.

10. The integrated circuit of claim 9, wherein the one or more diodes are transistors.

11. The integrated circuit of claim 9, wherein the one or more diodes are not active components of the integrated circuit and are not activated again after testing of the integrated circuit.

12. A method for testing for the presence of analog faults in an integrated circuit, the method comprising:
   providing one or more diodes each having an anode and a cathode, the one or more diodes coupled to one or more internal analog nodes, all operably coupled with a test pin;
   applying a potential across the diodes to generate a current;
   if a pull-up fault exists, then detecting the current at the cathode;
   if a pull-down fault exists, then detecting the current at the anode;
   wherein the potential is not generated by the integrated circuit;
   wherein the one or more diodes are physically remain in the integrated circuit and are not an active component of the integrated circuit and are not activated again after testing of the integrated circuit.

* * * * *